United States Patent [19]

Mohan Rao

[11] Patent Number: 5,701,270
[45] Date of Patent: Dec. 23, 1997

[54] SINGLE CHIP CONTROLLER-MEMORY DEVICE WITH INTERBANK CELL REPLACEMENT CAPABILITY AND A MEMORY ARCHITECTURE AND METHODS SUITBLE FOR IMPLEMENTING THE SAME

[75] Inventor: G. R. Mohan Rao, Dallas, Tex.

[73] Assignee: Cirrus Logic, Inc., Fremont, Calif.

[21] Appl. No.: 595,236

[22] Filed: Feb. 1, 1996

Related U.S. Application Data

[63] Continuation-in-part of Ser. No. 551,526, Nov. 1, 1995, Pat. No. 5,583,822, which is a continuation of Ser. No. 239,608, May 9, 1994, Pat. No. 5,473,573.

[51] Int. Cl.[6] ......................................... G11C 8/00
[52] U.S. Cl. ............... 365/230.03; 365/200; 365/230.06; 371/10.2
[58] Field of Search ............. 365/200, 230.06, 365/230.03, 225.7; 371/10.2, 10.3

[56] References Cited

U.S. PATENT DOCUMENTS

| | | | |
|---|---|---|---|
| 4,570,242 | 2/1986 | Nagami | 365/222 |
| 4,608,666 | 8/1986 | Uchida | 365/182 |
| 5,117,492 | 5/1992 | Nash | 395/400 |
| 5,159,572 | 10/1992 | Morton | 365/230.03 |
| 5,161,221 | 11/1992 | Van Nostrand | 395/425 |
| 5,200,925 | 4/1993 | Morooka | 365/219 |
| 5,245,585 | 9/1993 | Voss et al. | 365/238.5 |
| 5,265,231 | 11/1993 | Nuwayser | 395/425 |
| 5,278,801 | 1/1994 | Dresser et al. | 365/230.02 |
| 5,287,527 | 2/1994 | Delph et al. | 365/230.01 |
| 5,329,490 | 7/1994 | Murotani | 365/222 |
| 5,353,402 | 10/1994 | Lau | 395/162 |
| 5,377,154 | 12/1994 | Takasugi | 365/221 |
| 5,383,193 | 1/1995 | Pathak et al. | 365/201 X |
| 5,388,073 | 2/1995 | Usami et al. | 365/230.03 |
| 5,426,753 | 6/1995 | Moon | 365/230.03 X |
| 5,452,257 | 9/1995 | Han | 365/230.03 |
| 5,469,388 | 11/1995 | Park | 365/200 |
| 5,477,503 | 12/1995 | Wilson | 365/230.03 |
| 5,491,664 | 2/1996 | Phelan | 365/230.03 X |

OTHER PUBLICATIONS

"A Distributed Globally Replaceable Redundancy Scheme for Sub-Half-Micron VLSI Memories and Beyond" by Yagamara, Saito, Fujita, Nishimura & Anami, IEEE Journal of Solid State Circuits vol. 31, No. 2, Feb. 1996 pp. 195–201.

*Primary Examiner*—David C. Nelms
*Assistant Examiner*—Huan Hoang
*Attorney, Agent, or Firm*—James J. Murphy

[57] ABSTRACT

A memory subsystem 300 including processing circuitry 103 and first and second banks of memory 200/201. Each bank 200/201 includes a predetermined number of primary memory cells 200 and a predetermined number of redundant memory cells 205. An address bus 202 allows processing circuitry 103 to address at least one of the primary cells 200. The redundancy bus 301 allows processing circuitry 103 to address at least one of the redundancy cells 205.

26 Claims, 4 Drawing Sheets

SINGLE CHIP CONTROLLER-MEMORY DEVICE WITH INTERBANK CELL REPLACEMENT CAPABILITY AND A MEMORY ARCHITECTURE AND METHODS SUITBLE FOR IMPLEMENTING THE SAME

CROSS-REFERENCE TO RELATED APPLICATIONS

This application is a continuation-in-part of application Ser. No. 08/551,526, filed Nov. 1, 1995, now U.S. Pat. No. 5,583,822, which is a continuation of application Ser. No. 08/239,608 filed May 9, 1994, now U.S. Pat. No. 5,473,573.

TECHNICAL FIELD OF THE INVENTION

The present invention relates in general to digital electronic circuits and systems and in particular to a single chip controller-memory device with interbank cell replacement capability and a memory architecture and methods suitable for implementing the same.

BACKGROUND OF THE INVENTION

A typical processing system with video/graphics display capability includes a central processing unit (CPU), a display controller coupled with the CPU by a system bus, a system memory also coupled to the system bus, a frame buffer coupled to the display controller by a local bus, peripheral circuitry (e.g., clock drivers and signal converters), display driver circuitry, and a display unit. The CPU generally provides overall system control and, in response to user commands and program instructions retrieved from the system memory, controls the contents of graphics images to be displayed on the display unit. The display controller, which may for example be a video graphics adapter architecture (VGA) controller, generally interfaces the CPU and the display driver circuitry, exchanges graphics and/or video data with the frame buffer during data processing and display refresh operations, controls frame buffer memory operations, and performs additional processing on the subject graphics or video data, such as color expansion. The display driver circuitry converts digital data received from the display controller into the analog levels required by the display unit to generate graphics/video display images. The display unit may be any type of device which presents images to the user conveying the information represented by the graphics/video data being processed. The "display" may also be a printer or other document view/print appliance.

The frame buffer stores words of graphics or video data defining the color/gray-shade of each pixel of an entire display frame during processing operations such as filtering or drawing images. During display refresh, this "pixel data" is retrieved out of the frame buffer by the display controller pixel by pixel as the corresponding pixels on the display screen are refreshed. Thus, the size of the frame buffer directly corresponds to the number of pixels in each display frame and the number of bits (Bytes) in each word used to define each pixel. In a standard VGA system, each frame consists of 640 columns and 480 rows of pixels and when each byte is defined by 8 bits, the frame buffer must have a minimum capacity of 307,200 Bytes. For larger displays, such as a 1280 by 1024 display, approximately 1.5 MBytes or more of memory space is required. The required size of the frame buffer only further increases if more bits are used to define each pixel. It should be recognized that the size and performance of frame buffer memory is dictated by a number of factors such as, the number of monitor pixels, the monitor DOT clock rate, display refresh, data read/write frequency, and memory bandwidth, to name only a few.

Most frame buffers are constructed from random access memory devices (RAMs). Currently available RAM devices unfortunately have limitations on their use, mostly as a result of trade-offs that had to be made during their design and fabrication. Primarily due to expense and fabrication yields, RAM manufacturers are limited in the number of storage locations (cells) which can be provided on a single integrated circuit. Further, design tradeoffs must be made in the interests of minimizing the number of data and address pins, minimizing the number of devices required for a given memory system, and of optimizing the width of the data and address ports. For example, a 4 Mbit (0.5 Mbyte) RAM can be arranged as $4M\times1$ (i.e. storing 4 million 1-bit words), $1M\times4$, $512K\times8$, $256K\times16$, or $128K\times32$ (storing 128 thousand 32-bit words) device. At the one extreme, the $4M\times1$ architecture only allows access to a single bit per address thereby necessitating the use of 32 devices to completely service a 32-bit data bus. This construction disadvantageously consumes valuable board space. At the other extreme, a single $128K\times32$ device can service a 32-bit bus however the overall word storage capacity is relatively small and each chip/package requires 32 data pins alone along with 17 additional address pins (not to mention power, control, and feature pins). The need for a total of 39 data and address pins increases the size of the chip (as well as its package) due to minimum size requirements on each connection between the chip and its package and the need for level translator (driver) circuits to drive each such connection. As a consequence, RAM manufacturers have generally adopted the more practical architectures, such as the $256K\times16$ architecture. Even with the $256K\times16$ architecture however two devices are still required to service a 32-bit bus (or four to service a 64-bit bus) and each device still requires 18 address and 16 data pins for a 256K deep memory (which is very limited).

Conventional RAMs (dynamic RAMs) also disadvantageously employ a multiplexed addressing system. During a memory access, row address bits are sent to each DRAM on the address bus and latched into each device address decoder in response to a row address strobe ($\overline{RAS}$). The column address bits and column address strobe ($\overline{CAS}$) are then presented to each DRAM and latched into the corresponding address decoders, after which data can be written to or retrieved from the addressed locations in memory. Besides complicating the timing of the system memory addressing scheme, this process takes two master clocks instead of a single master clock.

Proposals have been put forth to put not only the entire frame buffer on a single chip but to also add the controller to the chip. A single controller/memory device would reduce the required board space and would eliminate the need for interconnection pins entirely. The primary obstacle to implementing these proposals has been the inability to solve the problem of achieving good yield during the chip manufacturing process. A state-of-the-art controller is normally fabricated using random logic circuitry which results in a typical die sort (fabrication) yield of 60–70%. Random logic circuitry is generally not "repairable." A memory however is usually fabricated as an array of rows and columns of memory cells. The repetitive nature of memory arrays allows for columns and rows containing defective cells to be "repaired" by substitution with redundant rows and columns provided on the chip. With the ability to "repair", the yield for memory devices can be increased. Typically however no more than 2–3% of a given array are provided as "repair cells" due to cost limitations. Further, in those cases where the memory cells are divided into blocks, the repair cells are typically not transferable from block to block. Therefore, a substantial number of defects in a block of memory cells normally cannot be repaired even if enough repair cells are available in the overall array. Currently, there are no means for accessing only the remaining operational blocks of the memory and thus the entire chip must be discarded in many cases.

The use of on-chip redundant rows and columns of cells for replacing defective rows and columns in a DRAM array is well established in the art. For example, the basics of defective cell replacement are set forth in Fitzgerald and Thomas, *Circuit Implementation of Fusible Redundant Addresses on RAMs for Productivity Enhancement*, IBM Journal of Research and Development, Vol. 24, No. 3, May 1980. Generally, in currently available multiple-bank devices, the wordlines of the primary rows and the input/output devices of the sense amplifiers of the primary columns of each bank are connected to the corresponding row and column decoders by programmable links, typically laser programmable fuses or electrically-programmable read-only memory (EPROM) cells. During probe testing, defective rows and/or columns are identified. Defective rows and columns are then functionally removed from the remainder of the array by programming the appropriate links such that addresses to the corresponding address decoder no longer select the defective rows and columns.

In a multiple bank device, each bank is fabricated with a given number of dedicated spare rows and spare columns (along with corresponding spare sense amplifiers). Typically, 5% of the rows and columns for a given array are redundant cells, at the most. Each spare row and column is associated with a programable address decoder/driver. When a defective row or column is functionally removed from the bank, the address decoder circuitry for a selected spare row/column is then programmed (again using programmable links) to respond to the same address to which the address decoder circuitry of the defective row was to respond. As a result, addresses to the defective row/column are redirected (steered) to a good redundant row/column and a required access made without error.

However, current repair techniques do not allow for the replacement of a defective row or column in one bank with a good redundant column of another bank without the payment of significant cost and performance penalties. Typically, each bank is addressable by a fixed set of row/column address bits which allow selected access to locations within the bank. The row/column address set (space) is typically the same for all banks in order to minimize circuitry overhead. One or more bank select bits then selects and activates the particular bank to be addressed (the deselected banks remain in standby). As a result, bank to bank row/column replacement without additional row/column address bits is not possible. For example, if Row 0 at Address 0 in Bank A is defective and Row 0 at Address 0 in Bank B is good, then Row 0 of Bank A cannot simply be replaced by disconnecting the defective row and programming a redundant row in Bank B to Address 0, since Address 0 in Bank B already maps to a good row. Additional address bits could be added to steer the address to defective Row 0 in Bank A to a redundant row outside the fixed address set of Bank B, but currently such a technique would create substantial difficulties.

The inability to efficiently perform bank to bank replacements of defective rows and columns results in the inability optimize yields in multibank systems. For instance, one bank may have more defective rows (or columns) than redundant rows (or columns) available for repair while another bank on the same chip may have an excess of redundant rows (or columns). Hence, notwithstanding the redundant cells available in the second bank, without bank to bank replacement capability, the chip would still be either completely unusable or only usable in a degraded form.

Thus, the need has arisen for an architecture which will allow the fabrication of a controller and associated memory as a single integrated circuit with high yields and thus reduced device cost. In particular, such an architecture should allow the fabrication of a display controller and an associated frame buffer on a single chip. Such an architecture should be applicable to memories of differing sizes and an output word arrangements. The need has also arisen for a memory architecture, in which functional portions of an otherwise defective memory chip can still be used. Additionally, such an architecture would preferably eliminate the generation and routing of $\overline{RAS}$ and $\overline{CAS}$ signals in DRAM operations. The architecture will also solve, in most cases, the "memory bandwidth" bottleneck to enhance total system performance. Finally, such an architecture should allow for replacement of a defective row or column of a given bank to be replaced with a row or column of any other bank or array in the memory subsystem. This feature would allow for the optimal use of the provided redundant cells thereby increasing chip yield.

SUMMARY OF THE INVENTION

According to one embodiment of the principles of the present invention, a memory subsystem is provided which includes processing circuitry and first and second banks of memory, each memory bank including a predetermined number of primary memory cells and a predetermined number of redundant memory cells. An address bus is included for allowing a processing circuitry to address at least one of the primary memory cells. A redundancy bus is provided for allowing the processing circuitry to address at least one of the redundancy cells.

According to another embodiment of the principles of the present invention, a memory device is provided which includes information processing circuitry and a plurality of arrays of rows and columns of memory cells, each array including a preselected number of primary rows and columns and a preselected number of redundant rows and columns. First address logic is included for addressing the primary rows and columns of cells in response to bits presented by the processing circuitry on a primary bus. Second address logic is included for addressing the redundant rows and columns in response to bits presented by the processing circuitry on a redundancy bus.

According to a further embodiment of the principles of the present invention, a processing system is provided which includes a controller, a redundancy bus, and a memory. The memory includes a plurality of banks each comprising an array of memory cells, each array including a preselected number of primary cells and a preselected number of redundant memory cells. Circuitry is provided for preventing access to defective ones of the primary cells of a first selected one of the banks. The memory further includes address decoding circuitry for accessing selected ones of the redundant cells in a selected one of the banks in response to a redundancy address presented by the controller on the redundancy bus, the redundancy address including a plurality of primary row/column address bits and at least one redundancy address bit. Finally, the controller is operable to generate the redundancy address to access the selected redundant cells in response to a need to access the defective primary cells.

The principles of the present invention are also embodied in the methods for replacing defective memory cells in systems including a controller and a multi-bank memory device. According to one method, a defective set of memory cells is identified in a first one of the banks, the defective memory cells associated with a bank select bit and a location address bit and addressable by the controller by a primary address bus. A redundant set of memory cells is programmed in a second one of the banks, the redundant set of cells addressable with a bank select bit, a primary location address bit, and a redundancy address bit by the controller via a redundancy address bus. Access is then steered from the defective set of cells to the corresponding redundant cells by addressing the redundant set of cells via the redundancy bus.

The principles of the present invention have substantial advantages over the prior art. Among other things, such principles allow for the replacement of a defective row or column of a given bank with a row or column of any other bank or array in the memory subsystem. This feature advantageously allows for the optimal use of the available redundant cells thereby allowing for increased chip yield.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
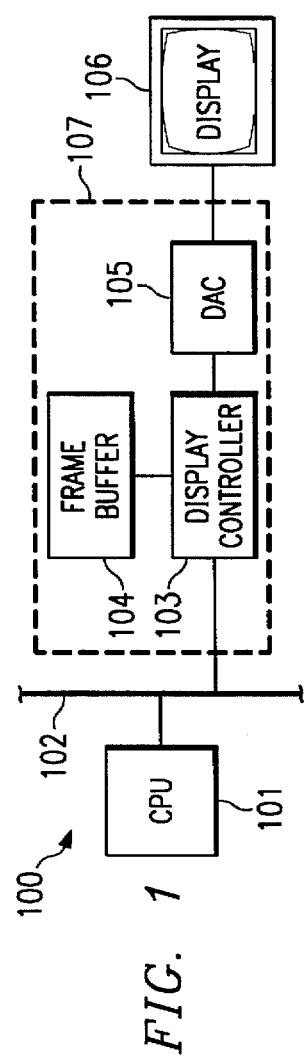
FIG. 1 is a functional block diagram of a processing system including a frame buffer-controller single chip device according to the principles of the present invention.

FIG. 1 is a high level functional block diagram of the portion of a processing system 100 controlling the display of graphics and/or video data. System 100 includes a central processing unit 101, a system bus 102, a display controller 103, a frame buffer 104, a digital to analog converter (DAC) 105 and a display device 106. According to the principles of the present invention, display controller 103 and frame buffer 104 and DAC 105 are fabricated together on a single integrated circuit chip 107.

CPU 101 controls the overall operation of system ("master") 100, determines the content of graphics data to be displayed on display unit 106 under user commands, and performs various data processing functions. CPU 101 may be for example a general purpose microprocessor used in commercial personal computers. CPU 101 communicates with the remainder of system 100 via system bus 102, which may be for example a local bus, an ISA bus or a PCI bus. DAC 105 receives digital data from controller 103 and outputs in response the analog data required to drive display 106. Depending on the specific implementation of system 100, DAC 105 may also include a color palette, YUV to RGB format conversion circuitry, and/or x- and y-zooming circuitry, to name a few options.

Display 106 may be for example a CRT unit or liquid crystal display, electroluminescent display (ELD), plasma display (PLD), or other type of display device displays images on a display screen as a plurality of pixels. Further, display 106 may be a state-of-the-art device such as a digital micromirror device or a silicon carbide like device (as described in the January 1994 issue of the IEEE Spectrum) which directly accepts digital data. It should also be noted that in alternate embodiments, "display" 106 may be another type of output device such as a laser printer or similar document view/print appliances.

Figure 2:
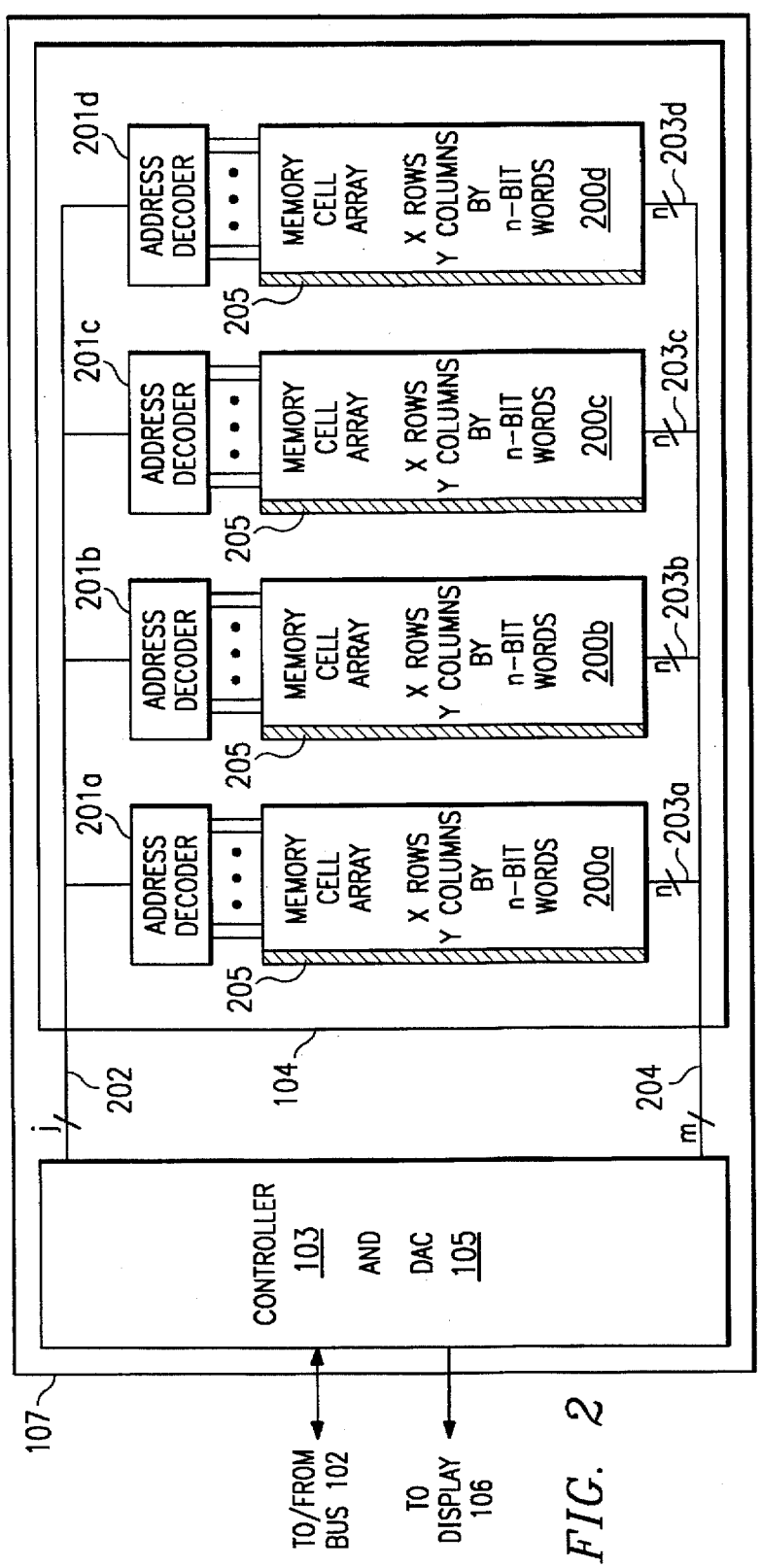
FIG. 2 is a more detailed functional block diagram of the frame buffer-controller device of FIG. 1 emphasizing a memory architecture particularly embodying the principles of the present invention.

FIG. 2 is a block diagram depicting in further detail integrated circuit 107. In FIG. 2, both controller 103 and frame buffer 104 are disposed on integrated circuit 107 within a novel architecture embodying the principles of the present invention. It should be noted that the novel architecture of frame buffer 104 itself is constructed in accordance with the principles of the present invention and demonstrating a manner in which these can be applied to memories with or without the presence of a controller on the same chip.

In the illustrated embodiment, controller 103 is a display controller with RAMDAC and phase-locked loop (PLL) on chip, such as a VGA controller, which among other things, controls the exchange of graphics and/or video data with frame buffer 103, controls memory refresh, and performs data processing functions such as color expansion. A display controller is the "master" for the specific application of display and thus frees up CPU 101 to perform computational tasks. Moreover, the architecture of a display controller optimizes it to perform graphics and video functions in a manner for superior to that of a general purpose microprocessor. Controller 103 may also include a color palette, cursor generation hardware, and/or video to graphics conversion circuitry, to name a few options. In embodiments employing a display controller, controller 103 could be a Cirrus Logic, Inc. controller of the 52XX,63XX, or CL-GD754x family. For example, display controller 103 may be one of the Cirrus Logic CL-GD754x series of display controllers. The structure and operation of such controllers is described in *CL-GD754x Application Book*, Rev. 1.0, Nov. 22, 1994, and *CL-GD7542x LCD VGA Controller Preliminary Data Book*, Rev. 1.0.2, June 1994, both available from Cirrus Logic, Inc., Fremont, Calif., and incorporated herein by reference.

Except to the extent described herein, the principles of the present invention are not dependant on the specific functional characteristics of controller 103. Thus, in alternate embodiments, controller 103 may be any one of a number of possible other general purpose microprocessor, controllers, or control devices which operate in conjunction with an associated random access memory. In general, controller 103 is a dedicated coprocessor which acquires, stores, manipulates, and outputs large arrays of data to memory. Controller 103 may be of the "bit map" class or of the "format memory" class (as described in the Apr. 18, 1994 issue of *Electronic Design*). Further, the principles of the present invention accommodate mixed-signal control devices on a single chip (die) and consequently, controller 103 may include mixed-signal drivers, clock doublers, phase-locked loops, and DAC's among other things. In the preferred embodiment, controller 103 is fabricated from random logic.

According to the principles of the present invention, frame buffer 104 is partitioned into a selected number of memory blocks 200. In the illustrated embodiment, four memory blocks 200a–200d are provided each of which contains an array of memory cells arranged as X number of rows and Y number of columns and configured, output a n-bit words per address. Each memory block is associated with an address decoder 201. Addresses of 1 number of bits are provided to each decoder 201 from controller 103 via a j-bit wide address bus 202. Preferably, each decoder 201/ block 200 responds to a different range of addresses in the controller address space. Each memory block includes n number of data lines 203 coupled to controller 103 via an m-bit wide data bus 204. Further, each memory block includes a number of redundant cells 205 (along with peripheral circuits such as sense amplifiers and enable/ disable fuses) for repairing defective cells by substitution. In the preferred embodiment, frame buffer 104 is constructed as a dynamic random access memory (DRAM); however, the present inventive concepts are not limited to DRAMs but may be applied, in alternate embodiments, to other types of memories such as static random access memories (SRAMs), read-only memories (ROMs), electrically erasable programmable read-only memories (EEPROMs), erasable programmable read-only memories (EPROMs).

The memory architecture of frame buffer 104 advantageously provides for flexibility in meeting the memory needs of controller 103, allows for the use of chips in which include substantial areas of defects, even after repair, and allows for optimized refresh time. For example, assuming that memory 104 has a total capacity of 2 Mbytes and each block 200 (in the preferred embodiment) has a storage capacity of 0.5 Mbyte, then controller 103, under software control, can select for use either 2 Mbyte, 1.5 Mbyte, 1 Mbyte or 0.5 Mbytes since each block 200 is assigned a band in the address space of controller 103. Further, if a given block contains defective cells even after the maximum allowed repair, the remaining blocks 200 can still be accessed by generating addresses only to those blocks and not to the defective block. Assuming for example that a 1280 by 1024 display is being used with a resolution of 8 bits per pixels, 1.5 MByte of memory is still sufficient allowing one block 200 to fail before the device 107 could not be used for that application. Additionally, if only some of the blocks 200 are required by controller 103, refresh need only be directed to the active block 200 thereby optimizing refresh time.

The number of output lines 203 from each memory block 200, the size of data bus 204 and the size of the cell array of each memory block 200, as well as the address map, are all flexible to meet the needs of the controller 103. For example, controller 103 may be designed to exchange data with frame buffer 104 via 32-, 64-, or 128-bit wide data bus 204. Depending on the width of bus 204, the parameters for the memory architecture of frame buffer can then be optimized. For illustrative purposes, assume that the overall storage capacity of frame buffer 104 is 2 Mbytes partitioned into four blocks 200 each having a capacity of 0.5 Mbyte. If bus 204 is assumed to be 64 bits wide, then each block could be constructed to have either 16, 32 or 64 data lines 203 for connection to data bus 204. In the case of 16 data lines 203 per block 200, each block 200 would be arranged as a 256K×16 device and all four blocks must be operational and accessed simultaneously to service the entire bus in a single cycle. When each block 200 is provided with 32 data lines, the block would be arranged as a 128K×32 device and only two of the blocks 200 must be operational (after maximum allowable repair) and accessed simultaneously to service the entire bus. If each block 200 is structured as a 64K×64 device with 64 data lines 203 are provided, only one block 200 needs to be operational and accessed to service a 64-bit bus 204. The selection of alternate configurations to service other bus widths is similar.

It should be noted that in alternate embodiments, blocks 200 may be interleaved. For example, if each block 200 has 64 data lines coupled to a 64-bit data bus 204, a sequence of 64-bit words could be accessed by sequentially addressing the blocks 200 (i.e., such that words in the sequence are accessed sequentially from two or more blocks 200). As another example, assuming again a 64-bit bus 204 and 64 data lines per block 200, a portion of 64 bit words could be accessed from different blocks 200 (i.e., one 32-bit word could be accessed from a first block 200 and a second 32-bit word accessed from a second block 200).

As indicated above, in the preferred embodiment, each block 200 and its associated address decoder 201 accommodate a different address range in the address space of processor 103. Further, a selected storage location within a selected block is addressed by a single address word; the ability to place controller 103 on the same chip as frame buffer 204 allows for sufficient lines to be run therebetween (without the need for level translators, and internal pins with their required spacing) such that both row and column address bits can be simultaneously presented to the address decoders 201. This feature eliminates the need for a multiplexed address bus and consequently the need to generate row address strobe (RAS) and column address strobe (CAS) signals.

The width of the address bus 202 is dependant on the number, size, and structure of the memory blocks 200. For example, when 256K×16 blocks are used, each 16-bit location in a given block 200 is accessed by an 18-bit address. If 128K×32 blocks are used, each 32-bit location is accessed by 17 bit address and, if 64K×64 blocks are used, each 64-bit location is accessed by a 16-bit address. In the illustrated embodiment where frame buffer 104 includes four memory blocks 200a–200d, two additional most significant bits are added to each address as block select bits. The number of block select bits will change in alternate embodiments depending on the number of blocks 200 employed.

The row/column structure of blocks 200 is also flexible; the number of bits desired per location equals the number of rows divided by the number of columns. Further, the number of row and column address bits per each address is dependant on the respective number of rows and columns. For example, each block is arranged as 2048 rows and 128 columns to provide 256K locations of 16 bits. The 18-bit address to each location in a block consequently includes 11 row address bits and 7 column address bits. A block 200 of 2048 rows and 64 columns will provide 128K locations of 32 bits each and addressed by 11 row and 6 column address bits. As a final example, a block 200 arranged as 2048 rows and 32 columns will provide 64K 64-bit locations each addressed by 11 rows and 5 column address bits. Numerous other combinations are possible.

In sum, memories, such as frame buffer 104 illustrated herein, employing an architecture according to the principles of the present invention have substantial advantages over the prior art. Among other things, the use of multiple independently address blocks allows for the isolation of a block with defective cells (after maximum repair) through address generation such that the remaining functional blocks can still be used. Further, the use of individually addressed blocks allows for the optimization of memory use; if only a portion of the capacity of memory 104 is required, processor 104, under software control, addresses only those blocks required access the required amount of memory space. In this case, refresh time can be reduced since only the active blocks will require refreshing. Finally, the ability to isolate faulty blocks, and thereby preserve the remaining operation blocks, allows the memory to be used in such applications as the combination controller-frame buffer device 107 where fabrication yield is critical.

The combination of controller 103 and frame buffer 104 on a single chip also has substantial advantages over the prior art. First, a single packaged integrated circuit takes up less board space (i.e. has a smaller form factor or "footprint") than two or more packaged chips. Second, the single chip controller/memory (frame buffer) embodiment eliminates both the number of internal and external pins normally required to electrically connect devices disposed on separate chips. According to the present invention, lines are simply run directly from circuit to circuit on the chip. Besides reducing inductive/capacitive loading on the corresponding driving circuitry, the elimination of the internal pins also allows for the chip size to be reduced and eliminates the need for the drivers normally required for chip to chip transmission. It should be noted that typically an internal pin is 50 µm wide and is spaced from neighboring pins by 50 µm. Lines directly run on the chip are typically only 1 µm wide and require only 1 µm spacing from each other. Further, because of the elimination of the pins and because the lines can be more efficiently (densely) run on a single chip, more address lines can be run from the controller to the memory. In the case of DRAMs, multiplexed address buses and the need to generate RAS and CAS signals are eliminated. Finally, the principles of the present invention enhance manufacturers productivity by offering "combination" solutions with one controller having various sizes of memory associated therewith—which is not possible with discrete solutions at the same cost.

Figure 3:
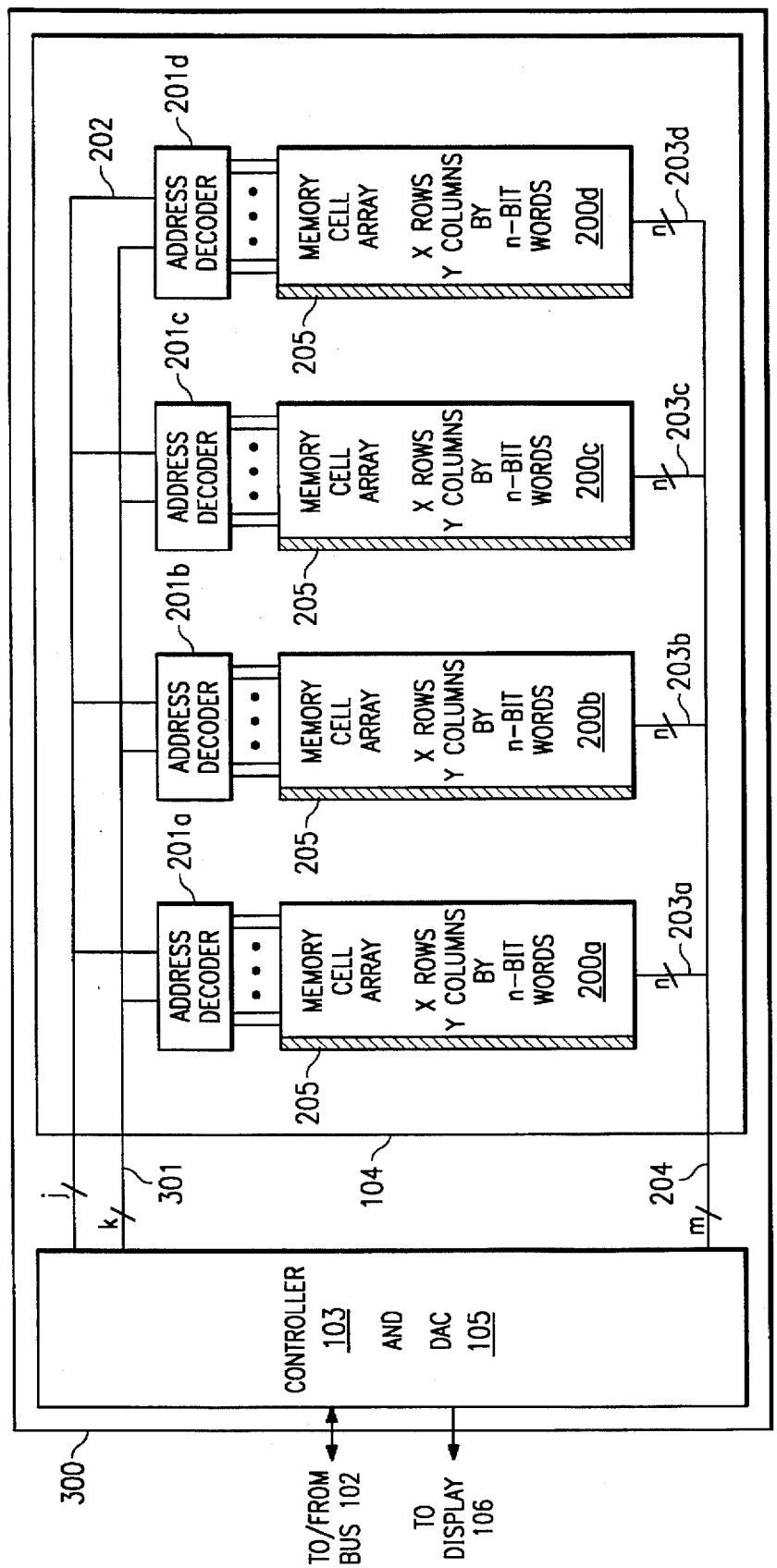
FIG. 3 is a functional block diagram of a second frame buffer-controller single chip device according to the principles of the present invention.

FIG. 3 is a high level functional block diagram of a second integrated controller—memory device 300 according to the principles of the present invention. Integrated device 300 further includes a k-bit wide redundancy address bus 301. Redundancy bus 301 carries addresses allowing controller 103 to access redundant (spare) rows and columns 205 which are programmed to lie outside the primary address set (space)(i.e. that set of addresses used to access the primary rows and columns of cells of arrays 200). As will be discussed below, this advantageously allows for the steering of an access directed to a defective row or column in a first array 200 to an appropriately programmed redundant row or column in any other array 200.

In the preferred embodiment of integrated device 200, redundancy address bus carries the primary address bits and bank (block) select bits discussed above along with a predetermined number of redundancy address bits. The number of redundancy address bits is a function of the number of redundant rows/columns provided per bank. Preferably, the width of redundancy bus k, is equal to j+r, where j is equal to the number of row/column bits P in a non-multiplexed address system plus the number bank select bits B (i.e. j=P+B) and r is the number of redundancy address bits. Preferably, the number of redundant rows or columns per bank 200 equals $2^r$.

Figure 4:
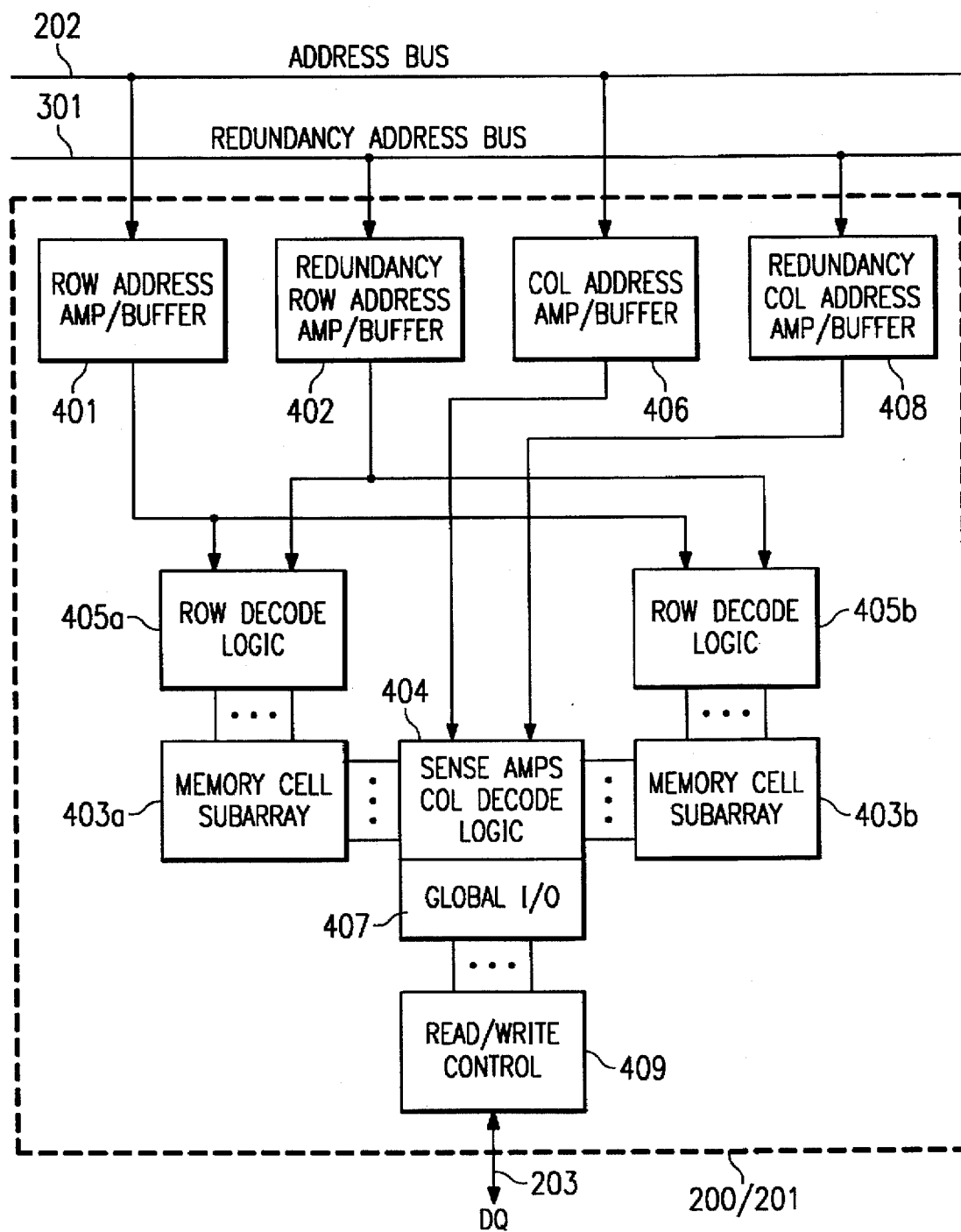
FIG. 4 is a more detailed functional block diagram of a selected block (bank) depicted in FIG. 2.

FIG. 4 is a more detailed functional block diagram emphasizing the interface between address bus 202 and redundancy address bus 301, and a selected address decoder 201 and corresponding cell array 200. Preferably, the rows of each memory array 200 are partitioned into two subarrays 403a and 403b, with each address decoder 201 correspondingly including two blocks of row decoder logic 405a and 405b for controlling the wordlines of the respective subarrays 403.

As discussed above, each block (bank) includes a selected number of redundant rows and columns of cells. Preferably, the number of redundant rows and columns is less than 5% of the number of primary rows and columns. Additionally, the number of redundant rows provided in subarray 403a is preferably equal to the number of redundant rows provided in subarray 403b.

In a preferred non-multiplexed addressing system, all of address and bank select bits are pipelined from address bus 202 to row decoder logic 405 through row address amplifiers/buffers 401. Similarly, all address and bank select bits, including the redundancy address bits, on redundancy address bus 301, in a non-multiplexed addressing scheme, are pipelined to row decoder logic 405 through redundancy amplifiers/buffers 402.

In the preferred non-multiplexed addressing scheme, all j number address and bank select bits are pipelined from address bus 202 through column address amplifiers/buffers 406 to sense amplifiers/column decode logic 404. In the embodiment of FIG. 4, where each array 200 is divided into two subarrays 403a and 403b, column decoders/sense amplifiers 404 are disposed between the cell subarrays, as is typical in the art. Column decoder logic 404 selectively enables or disables the amplifiers of global input/output circuitry 407 which control access to the columns of cells through the sense amplifiers coupled to the bitlines of each physical column of cells. Global input/output circuitry may be pipelined (cascaded) or non-pipelined. During accesses to redundant columns in the preferred embodiment, all k number address and bank select bits presented on redundancy bus 301 are pipelined through redundancy amplifiers/buffers 408.

Alternatively, address bus 202 and redundancy address bus 301 may be multiplexed. In this case, row address bits alone would be pipelined through row address amplifier/buffers 401 and redundancy address amplifiers/buffers 402 from address bus 202 and redundancy address bus 301 respectively. Similarly, in a multiplexed address system, only column address bits would be pipelined through column address amplifiers/buffers 406 and redundancy column address amplifiers/buffers 408. In the case of redundancy addressing, redundancy address bits to redundant rows are pipelined along with the remaining row address bits through buffer/amplifiers 402 and redundancy address bits to redundant columns are pipelined along with the remaining column address bits through buffers/amplifiers 408.

Figure 5:
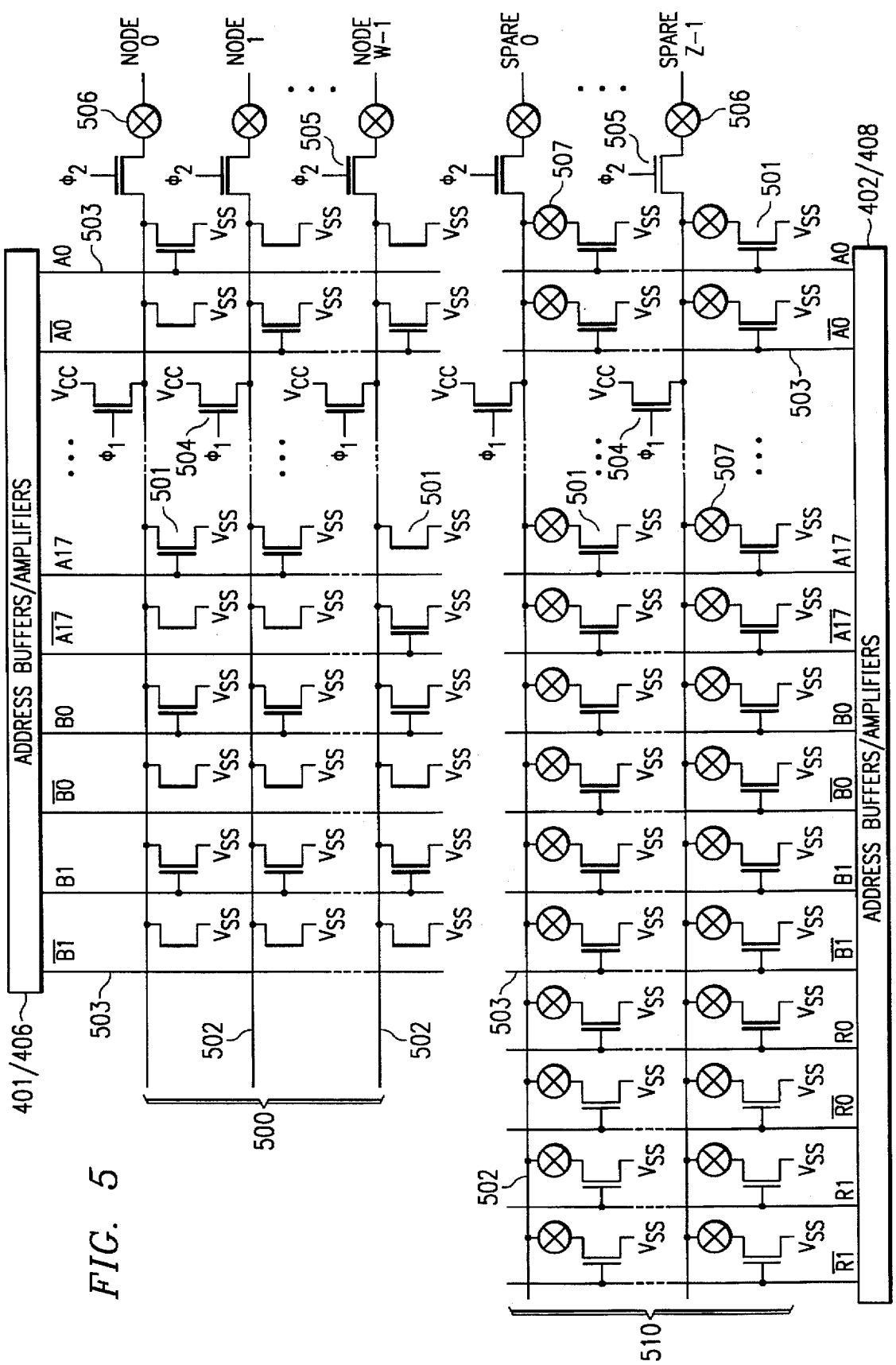
FIG. 5 is an electrical schematic diagram of selected address decoder circuitry suitable for use in the decoder logic depicted in FIG. 4.

FIG. 5 is a electrical schematic diagram of a representative portion of preferred decoder logic suitable for use in row decoder logic 405 and/or column decoder logic 404. Each block of decoder logic 404/406 includes a set of primary decoders 500 for controlling the primary rows/columns of a given subarray 403 and a set of redundant (spare) decoders 510 for controlling the redundant rows/columns of a given subarray 403.

In the case of row decoder logic 405, the primary control nodes NODE 0—NODE W-1 are each coupled to a corresponding one of the X number of wordlines of X number of rows in a given bank 200 (i.e. W=X), with Nodes 0 to W/2-1 controlling wordlines 0 to X/2-1, disposed in subarray 403a, and Nodes W/2 to W-1 controlling wordlines X/2 to X-1, disposed in subarray 403b. The control nodes SPARE 0—SPARE Z-1 are coupled to the wordlines of Z number of corresponding rows of redundant cells 205.

In the case of column decoder logic 406, control nodes NODE O to NODE W-1 are coupled the amplifiers/buffers of global input/output circuitry 407 and control the selection of one of the Y number of columns in the corresponding array 200 per column address. As is convention, a "column" herein references one physical column of cells and at least one corresponding bitline for a "by 1" device, 16 physical columns of cells and at least 16 corresponding bitlines for a "by 16" device, and so on. Similarly, with regards to redundant decoders 510 within column decode logic 404, each control node SPARE 0—SPARE Z-1 allows the selection of one redundant column, of one or more physical columns, per column address.

Each decoder 500 and 510 in the illustrated embodiment is a NOR decoder comprising a linear array of transistors 501 coupled to a conductive line 502. For decoders 500 controlling primary row/column address lines, the source of each transistor 501 is preferably directly connected to the corresponding line 502. In the case of the redundant decoders 510, the source of each transistor 501 is coupled through a programmable link 507. The number of transistors 501 required in each decoder is a function of the number of address and bank select bits, and in the case of redundancy decoders 510, also the number of redundancy address bits, being decoded.

For discussion purposes, assume that the memory of device 300 includes 4 banks 200 each organized as 256k by 16 and arranged as 512 rows and 512 columns of 16 bits. Also assume that up to 4 redundant rows and up to four redundant columns are provided per bank (i.e. Z=4). For non-multiplexed addressing scheme therefore, each address word to a primary row or column includes 18 location address bits A0–A17 and two bank select bits B0–B1. Their complements $\overline{A0-A17}$ and $\overline{B0-B1}$ are generated as required to implement the preferred NOR logic in decoders 500. Hence, each primary decoder in this example 500 includes 40 transistors 501. Address words presented to each redundancy decoder 501 also include bits $\overline{A0-A17}$, bank select bits $\overline{B0-B1}$. Their complements $\overline{A0-A17}$ and $\overline{B0-B1}$, along with two redundancy address bits R0–R1 and their complements $\overline{R0-R1}$. Thus, each redundancy decoder 510 in this example includes 44 transistors 501.

Each decoder 500/510, includes a plurality of lines 503 which couple the address and bank select bits to the gates of selected transistors 501 from amplifiers/buffers 401 or 406 in the case of primary decoders 500 or address amplifiers/buffers 402 or 408 in the case of redundancy decoders 510. The gates of other selected transistors 501 are "no connects" as required to allow each decoder 500/510 to respond to a unique address while maintaining an appropriate capacitive loading on the corresponding line 502.

Each decoder 500/510 includes a pair of transistors 504 and 505 which control the precharging of an associated control line 502. During precharge, transistors 504 are turned-on by clock $\phi_1$ and transistors 505 are turned-off by clock $\phi_2$. Control lines 502 are then pulled to Vcc through transistor 504. Next, control lines 502 are selectively pulled down, or allowed to achieve desired voltage in the case of the selected row or column, by transistors 501 in response to the addresses from the corresponding address register 401 or 402. Transistors 505 are then turned on to couple each line 502 to the associated DECODE node.

Each primary decoder 500 and redundant decoder 506 is coupled to the corresponding wordline or global I/O circuitry through a programmable device 506. Programmable device 506 may be for example a laser programmable link, such as a laser programmable fuse, or an electrically programmable link, such as an electrically programmable read-only memory (EPROM). Programmable devices 506 allow a decoder 500 to be disconnected from the associated row or column of cells, if such row or column is defective, thereby making that row or column unaddressable. Unused or defective rows or columns of redundant cells can be similarly rendered unaddressable through use of programmable devices 506.

The source of each transistor 501 of redundant decoder circuitry 510 is coupled to the corresponding control line 502 through a programmable device 507. Programmable devices 507 allow redundant decoders 510 to be programmed to replicate the connection/no connection pattern of the transistors 501 of a decoder 500 of a defective row or column. Programmable devices 507 may also be laser fuses, EPROMs, or other laser- or electrically-programmable links.

Redundancy bus 301 and the additional redundancy bits presented thereon, advantageously allow for the steering of an access directed to a defective row or column in one bank 200 to good row in another bank 200. Specifically, redundancy bus 301 allows for addressing of the redundant rows/columns 205 independent of the addressing of the primary rows and columns through address bus 202. The redundancy address bits increase the size to the address set (space) to each bank to accommodate unique addressing of redundant rows/columns. Hence, even if the lower order address bits are identical for a good primary row/column and a programmed redundant row in the same bank, the redundancy address bits Rz insure that an access is not steered to multiple rows/columns during replacement.

A typical replacement (repair) according to the principles of the present invention is as follows. For discussion purposes, assume that a row replacement is required in bank 200a (Bank 0) and that the replacement row will be selected from the redundant rows of bank 200b (Bank 1). It should be noted that this procedure will be substantially the same for a column replacement and for replacements of rows or columns between any other combinations of pairs of banks 200.

Defective rows and columns of cells are normally identified during wafer probing using conventional test equipment known in the art. The addresses of the identified defective rows and columns are stored in the tester. For discussion purposes, also assume that Row 0 in Bank A with address 0 and bank select bits 00 has been identified as defective.

The row decoder 500 for defective Row 0 of Bank A is disabled by opening the corresponding programmable link 506. An unused replacement row decoder 510 in Bank B is selected and programmed by opening selected programmable links 507 as required for the selected replacement decoder 510 to respond to a given set of primary address bits, bank select bits and redundancy address bits to which the address and bank select bits of defective Row 0, Bank A will be translated.

In this example, the lower order address bits A0–A17 which are programmed into the selected redundant decoder 510 are the same as those programmed into the now disabled primary row decoder 500 (i.e. to address 0). Although this may reduce the complexity of the address translation discussed below, is not a requirement of the present invention. Specifically, because each redundancy decoder 510 decodes one or more redundancy bits, any combination the lower order bits A0–A17 may be selected, consistent with the programming of other redundant row/column decoders 510 in the selected bank.

The bank select bits B0–B1 programmed into the selected redundancy decoder are preferably the same as those assigned to the bank 200 in which that redundancy decoder is disposed. In the present discussion where the replacement row is in Bank 1, the programmed bank select bits are 01. In addition to being decoded by primary and redundancy decoders 500 and 510, the bank select bits also control the activation and the standby states of all banks 200.

The redundancy address bits programmed into the selected redundancy decoder 510 are selected based on such factors as the number of redundancy decoders remaining for use in the given bank, the addressing scheme of controller 103, among other things. It should be noted that in alternate embodiments, the bank select bits and/or redundancy bits could be hardwired into the corresponding transistors 501 for a given redundancy decoder 510 of a given bank (i.e. the associated links 507 foregone). In this case, only the lower order bits Ap and $\overline{Ap}$ would be programmed.

Controller 103 is programmed either in hardware (e.g. microcode ROM, hardwired) or in software to identify the addresses to the defective rows and columns and the addresses to the associated replacement rows and columns. When a defective row or column is addressed during normal operation (e.g. in response to an instruction or command from the operating system software, applications software, firmware, or the user), that address is translated to the address of the associated replacement row/column, for example by changing the bank select bits (if a bank change is required) and adding redundancy address bits. In the present example, the lower order address bits A0–A17 remain the same (Address 0), the bank select bits B0–B1 are translated from 00 (Bank 0 to 01 (Bank 1), and two redundancy bits R0–R1 are added. Address translation may be accomplished using a TLB (Translation Look ASIDE BUFFER) or look-aside buffer.

The new address is presented on the redundant address bus 301 to implement the access. In the preferred embodiment, the row/column address and bank select bits to the defective row in Bank 0 are still presented on address bus 202, although no access will occur since the corresponding decoder 500 has been disabled.

In sum, the principles of the present invention advantageously provide for the optimization of row/column repairs. Specifically, in multi-bank systems, inter-bank row/column replacements can be implemented, thereby allowing the available redundancy resources to be put to their best use. For example, if all the redundant rows/columns of one bank have been used for repairs, yet redundant rows or columns remain in another bank, the first bank can still be repaired and the full capability of the overall device maintained as a result.

Although the present invention and its advantages have been described in detail, it should be understood that various changes, substitutions and alterations can be made herein without departing from the spirit and scope of the invention as defined by the appended claims.

What is claimed is:

1. A memory subsystem comprising:

processing circuitry;

first and second banks of memory, each said bank including a predetermined number of primary memory cells and a predetermined number of redundant memory cells;

a primary address bus for allowing said processing circuitry to address at least one of said primary memory cells, said at least one primary memory cell residing in a primary cell memory space; and a redundancy bus for allowing said processing circuitry to address at least one of said redundancy cells, said at least one redundancy cell residing in a redundacy cell memory space separate from said primary cell memory space.

2. The memory subsystem of claim 1 wherein each of said banks includes an array of rows and columns of primary memory cells, at least one column of redundant memory cells, and at least one row of redundant memory cells.

3. The memory subsystem of claim 2 wherein each said array is associated with address decoder circuitry for addressing said rows and columns of memory cells, said address decoder circuitry comprising:

primary row decoder logic for selecting for access a said one of said primary rows in response to address bits presented on said primary address bus;

primary column decoder logic for selecting for access a said one of said primary columns in response to address bits presented on said primary address bus;

redundancy row decoder logic for selecting for access a said one of said redundant rows in response to address bits presented on said redundancy bus; and redundancy column decoder logic for selecting for access a said one of said redundant columns in response to address bits presented on said redundancy bus.

4. The memory subsystem of claim 1 wherein said primary address bus comprises a non-multiplexed bus.

5. The memory subsystem of claim 1 wherein said redundancy bus comprises a non-multiplexed bus.

6. The memory subsystem of claim 1 wherein said memory cells comprise dynamic random access memory cells.

7. The memory subsystem of claim 1 wherein said processing circuitry and said first and second memory banks are fabricated on a single integrated circuit chip.

8. The memory subsystem of claim 1 wherein said processing circuitry comprises a display controller.

9. A memory device comprising:

information processing circuitry;

a plurality of arrays of rows and columns of memory cells, each said array including a preselected number of primary rows and columns and a preselected number of redundant rows and columns;

first address logic for individually addressing said primary rows and columns of cells in response to bits presented by said processing circuitry on a primary address bus, said bits presented on said primary address bus defining a primary address space in which said primary rows and columns reside;

second address logic for individually addressing said redundant rows and columns in response to bits presented by said processing circuitry on a redundancy bus, said bits presented on said redundancy bus defining a redundancy address space in which said redundant rows and columns reside.

10. The memory device of claim 9 wherein said bits presented on said primary address bus comprise at least one location address bit and at least one bank select bit.

11. The memory device of claim 10 wherein said at least one location address bit comprises a plurality of row and column address bits presented on said primary address bus in a non-multiplexed format.

12. The memory device of claim 9 wherein said bits presented on said redundancy address comprise at least one location address bit, at least one bank select bit, and at least one redundancy address bit.

13. The memory device of claim 12 wherein said at least one location address bit comprises a plurality of row and column address bits presented on said redundancy bus in a non-multiplexed format.

14. The memory device of claim 9 wherein said first address logic comprises a plurality of row decoders and a plurality of column decoders coupled to said primary address bus, each of said row and column decoders including disabling circuitry.

15. The memory device of claim 14 wherein each of said row and column decoders effectuate NOR logic in response to said bits received on said primary address bus.

16. The memory device of claim 14 wherein said disabling circuitry comprises a programable link.

17. The memory device of claim 9 wherein said second address logic comprises a plurality of redundant row decoders and a plurality of redundant column decoders coupled to said redundancy bus, each of said decoders including programing circuitry for controlling a response to said bits presented on said redundancy bus.

18. The memory device of claim 17 wherein each of said redundant row and redundant column decoders effectuate a NOR logic in response to said bits received on said redundancy address bus.

19. The memory device of claim 17 wherein said programming circuitry comprises a plurality of programmable links.

20. A processing system comprising:
a controller;
a redundancy bus;
a memory comprising:
a plurality of memory banks each comprising an array of memory cells, each said array including a preselected number of primary cells and a preselected number of redundant memory cells;
circuitry for preventing access to defective ones of said primary cells of a first selected one of said banks; and
address decoding circuitry for accessing selected ones of said redundant cells in a second selected one of said banks in response to a redundancy address presented by said controller on said redundancy bus said redundancy address including a plurality of primary row/column address bits and at least one redundancy address bit; and
wherein said controller is operable to generate said redundancy address to access said selected redundant cells in response to need to access said defective primary cells.

21. The system of claim 20 wherein said controller and said memory are fabricated as a single chip integrated controller-memory device.

22. The system of claim 20 and further comprising a central processing unit coupled to said controller by a system bus.

23. The system of claim 20 wherein said defective primary cells are associated with an address and said controller generates said redundancy address by translating said address associated with said defective primary cells.

24. The system of claim 23 wherein said address associated with said defective primary cells comprises a plurality of row/column address bits and at least one bank select bit and said redundancy address comprises a plurality of row/column address bits, at least one bank select bit and at least one redundancy address bit.

25. A method of replacing defective memory cells in a system including a controller and a multi-bank memory device, the memory comprising the steps of:
identifying a defective set of memory cells in a first one of the banks, the defective memory cells associated with a bank select bit and a location address bit and addressable by the controller via a primary address bus;
programming a redundant set of memory cells in a second one of the banks, the redundant set of cells addressable with a bank select bit, a primary location address bit, and a redundancy address bit by the controller via a redundancy address bus; and
addressing the redundant set of cells via the redundancy bus in response to a need by the controller to access the defective set of cells.

26. The method of claim 25 wherein said step of addressing the redundant cells comprises the substep of translating the address associated with the defective cells to generate the address to the redundant set of cells.

* * * * *